United States Patent
Peng

(12) United States Patent (10) Patent No.: US 6,933,521 B2
Peng (45) Date of Patent: Aug. 23, 2005

(54) ORGANIC ELECTROLUMINESCENT DEVICE ADAPTED FOR ASSEMBLY FUNCTION

(76) Inventor: Kuan-Chang Peng, No. 8, LN 213, Sec. 2, Jingguo Rd., Hsinchu (TW), 300

( * ) Notice: Subject to any disclaimer, the term of this patent is extended or adjusted under 35 U.S.C. 154(b) by 21 days.

(21) Appl. No.: 10/618,670

(22) Filed: Jul. 15, 2003

(65) Prior Publication Data

US 2005/0012103 A1 Jan. 20, 2005

(51) Int. Cl.[7] .............................. H01L 35/24; H01J 1/62; G02F 1/1335
(52) U.S. Cl. ......................... 257/40; 257/98; 313/500; 313/503; 349/69
(58) Field of Search .............................. 257/40, 98, 99, 257/103; 313/500, 503, 506, 508; 349/69

(56) References Cited

U.S. PATENT DOCUMENTS

| | | | | |
|---|---|---|---|---|
| 2002/0068191 A1 | * | 6/2002 | Kobayashi | 428/690 |
| 2004/0090178 A1 | * | 5/2004 | Chuang | 313/506 |
| 2004/0201027 A1 | * | 10/2004 | Ghosh | 257/99 |

* cited by examiner

Primary Examiner—David Nelms
Assistant Examiner—Long Tran
(74) Attorney, Agent, or Firm—Rosenberg, Klein & Lee

(57) ABSTRACT

An organic electroluminescent device adapted for assembly function of a greater display size is provided. The device comprises forming first electrodes, a light-emitting layer, second electrodes, and isolating seal cap in turn. One side of the isolating cap is chiseled to form at least one channel, each channel being passed through by a corresponding connecting line. The end faces of the connecting lines may be contacted with a part of surface the first electrodes or second electrodes formed inside the isolating seal cap. The side ends of the first electrodes and second electrodes may be not necessarily exposed outside the isolating seal cap, due to the fact that the contacting point between the first electrodes or second electrodes and the connecting lines may be formed inside the isolating seal cap, whereby the area of the substrate, the first electrodes, and the second electrodes exposed outside the isolating seal cap may be reduced, further greatly decreasing the size of the gap during the assembly for two light-emitting devices correspondingly as well. Not only adapting for the assembly for a larger-sized display device, but also effectively increasing the quality requirement for higher resolution of the light-emitting device may be provided.

10 Claims, 6 Drawing Sheets

ORGANIC ELECTROLUMINESCENT DEVICE ADAPTED FOR ASSEMBLY FUNCTION

FIELD OF THE INVENTION

The present invention is related to an organic electroluminescent device, particularly to an organic electroluminescent device adapted for assembly function. Not only adapting for the assembly for a larger-sized display device, but also effectively raising the quality requirement for high resolution of the electroluminescent device may be provided.

BACKGROUND

The organic electroluminescent device (referred to as an OLED device hereinafter) is focused and used by all circles, among new-generation display panels, owing to advantages of a large view angle, short response time, thin display thickness, lower power consumption, simple manufacturing process, endurance for collision, absence of backlight source, capability for emitting full-color light thereof.

Referring to FIGS. 1 and 2, there are shown a structural cross-section view and a top view of a conventional OLED device, respectively. The conventional OLED device essentially comprises forming electrodes 13 on a part of surface of a substrate 11, forming a light-emitting layer 15 at least including an organic emitting layer, and second electrodes 17 in turn, by vapor deposition or sputtering methods and so on, onto the appropriate position of the first electrodes 13. Subsequently, an isolating seal cap 19 capable of, by means of a seal pad 16, covering and protecting the organic layer 15 may be erected on the vertical-extending position of a part of surface of the substrate 11. By means of first connecting lines 14 and second connecting lines 18, respectively, the first electrodes 13 and the second electrodes 17 are connected to controllers 30, 33, such as a column driver, row driver, or central controller, controlling whether the power is supplied or not. Based on the power supply control provided by the controller 30, 33, injecting electrons or holes into which one of the first electrodes 13 or which one of the second electrodes 17 may be determined. The recombination of the electrons and holes is then effected in the light-emitting layer 15, in order for exciting the composition material of the light-emitting layer 15 for the generation of light source, whereby the illumination is obtained.

For contacting the first connecting lines 14 and the second connecting lines 18 with the corresponding first electrodes 13 and the second electrodes 17, a part of the volume of the first electrodes 13 and the second electrodes 17 may be necessarily exposed outside the isolating seal cap 19, the width of the exposed portion being approximately 1.5 mm, as illustrated as a1; a part of the volume of the substrate 11 is also exposed outside the first electrodes 13 and the second electrodes 17, the width of the exposed portion being approximately 0.5 mm, as illustrated as a2.

As shown in FIG. 3, in the case of assembling the conventional organic electroluminescent device as a large-sized display device, a plurality of OLED devices are combined one with another. In other words, the substrates 11, 21 of two OLED devices are closed tightly, and a gap a3 existed between the adjacently-situated electrodes 17, 27 of the two OLED devices must be presented. This gap is formed by the substrates 11, 21 exposed outside the isolating seal cap 19, the spacing between the first electrodes 13, 27, and the distance "a" between the first one of the electrodes and the isolating seal cap 19, as well as is not less than the doubled (a1+a2+a). For the purpose of having an identical pitch a4 between two adjacently-situated scanning lines or data lines (the distance between two adjacently-situated first electrodes or two adjacently-situated second electrodes) in the assembled OLED display device while viewing, the width of the a4 must be designed as equivalent to that of a gap a3, resulting in wasting the space when assembling the OLED device, further being seriously harmful to the quality requirement for high resolution of the OLED device.

SUMMARY OF THE INVENTION

Therefore, designing an OLED device effectively solving the problems of the aforementioned conventional structure, not only adapting for the assembly for a larger-sized display device, but also having a quality requirement for high resolution of the OLED device is critical to the present invention.

Accordingly, it is a primary object of the present invention to provide an organic electroluminescent device adapted for assembly function, capable of covering the first electrodes and the second electrodes inside the isolating seal cap completely, resulting in greatly reducing the area of the substrate exposed outside the isolating seal cap, whereby the size of the gap may be reduced when assembling every two of the OLED devices, correspondingly reducing the size of the spacing between every two of the first electrodes or every two of the second electrodes as well. Therefore, the quality requirement for high resolution may be raised significantly.

It is a secondary object of the present invention to provide an organic electroluminescent device adapted for assembly function, capable of greatly reducing the area of the substrate, the first electrodes or the second electrodes exposed outside the isolating seal cap to a size being beneficial for assembling.

It is another object of the present invention to provide an organic electroluminescent device adapted for assembly function being beneficial for the flexible design in product specifications, by greatly reducing the area of the substrate, the first electrodes or the second electrodes exposed outside the isolating seal cap.

DETAILED DESCRIPTION

The structural features and the effects to be achieved may further be understood and appreciated by reference to the presently preferred embodiments together with the detailed description.

Figure 1:
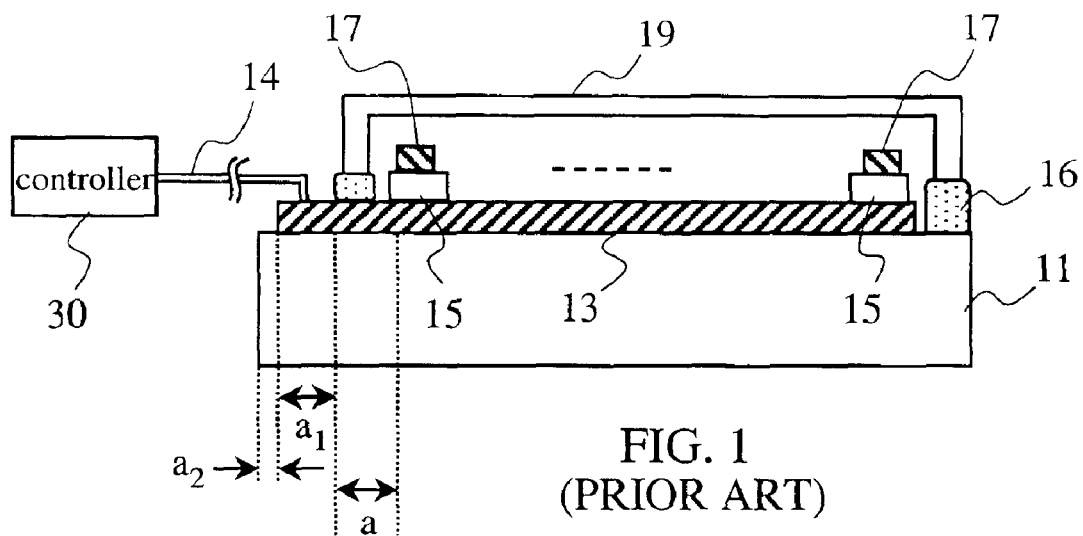
FIG. 1 is a structural cross-section view of a conventional organic electroluminescent device.
Figure 2:
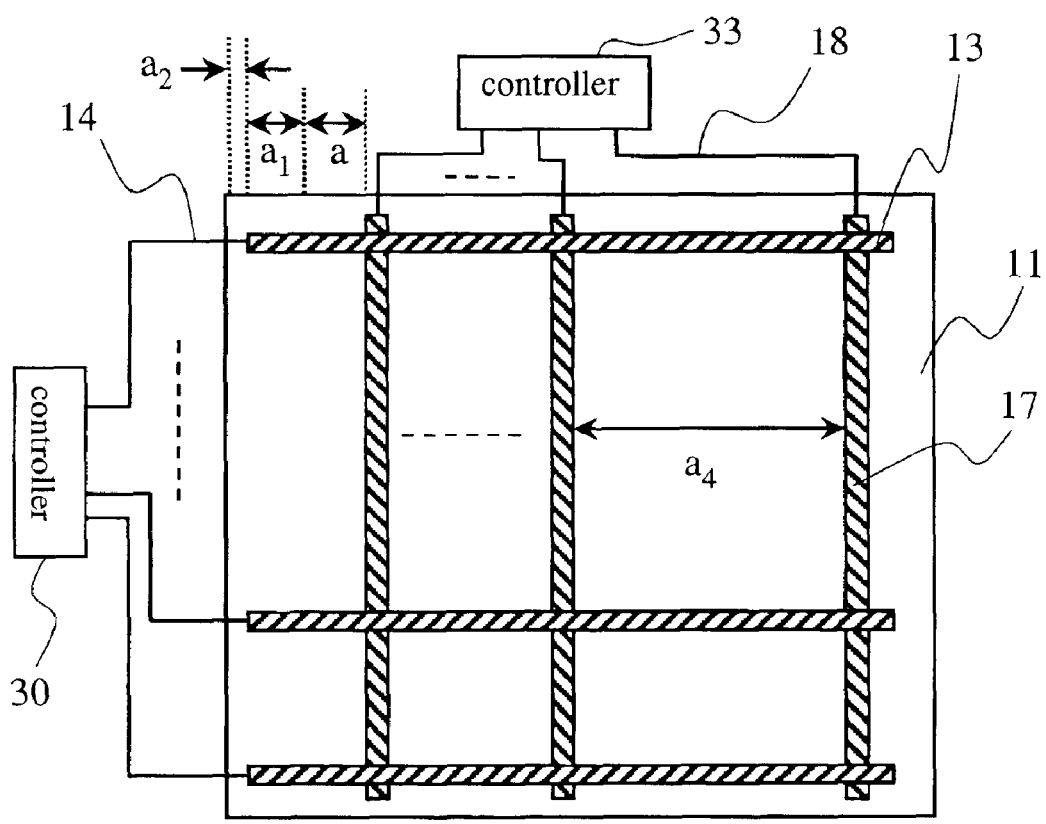
FIG. 2 is a top view of the conventional organic electroluminescent device.
Figure 3:
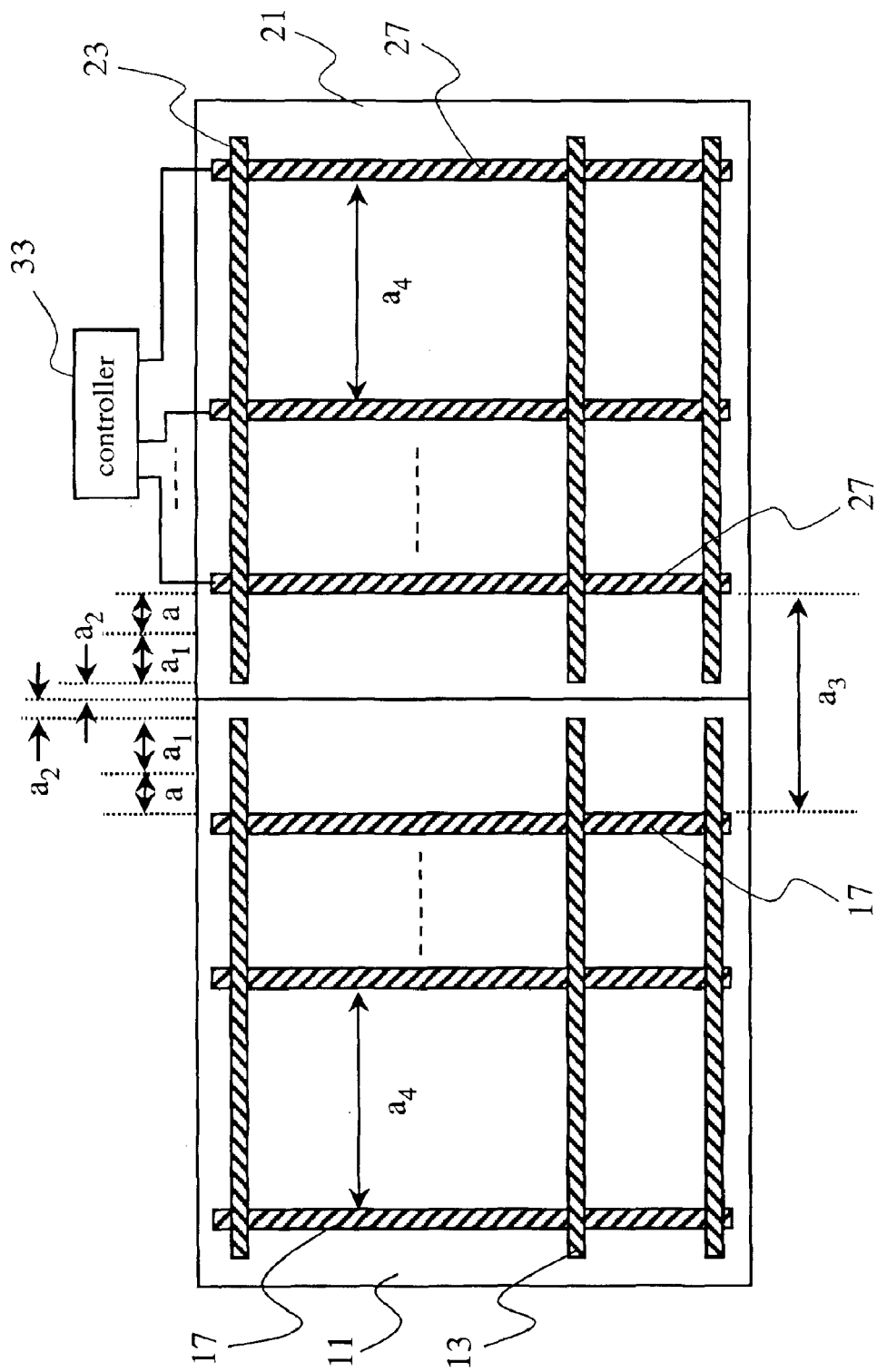
FIG. 3 is a diagrammatical top view of the conventional organic electroluminescent device when assembling.
Figure 4:
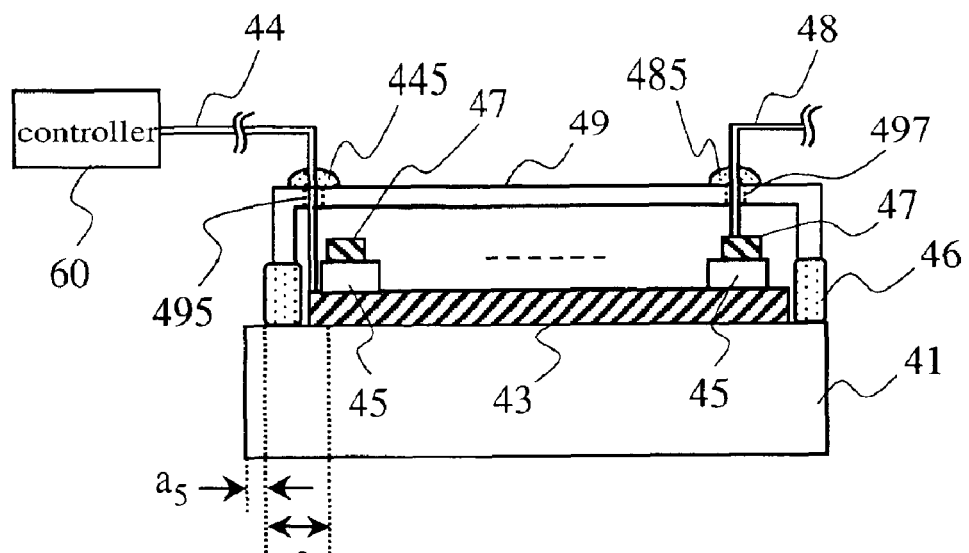
FIG. 4 is a structural cross-section view of an organic electroluminescent device of a preferred embodiment of the present invention.
Figure 5:
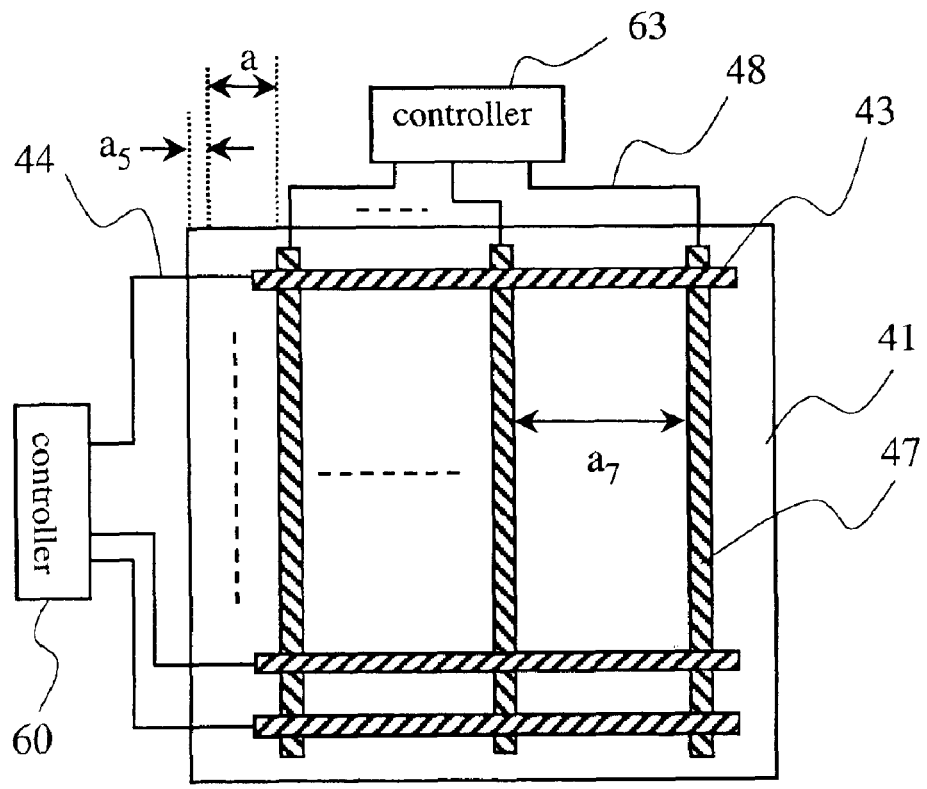
FIG. 5 is a top view of the device shown in FIG. 4 of the present invention.

Firstly, referring to FIGS. 4 and 5, there are shown a structural cross-sectional view and a top view of an organic electroluminescent device of a preferred embodiment of the present invention; as illustrated in the figures, the present invention essentially comprises forming a first electrode 43 on a part of surface of a substrate 41, and forming at least one light-emitting layer 45 including an organic emitting layer, and a second electrode 47 in turn, by vapor deposition, sputtering, chemical vapor thin-film deposition, or spray pyrolysis methods and so on, onto the appropriate position of the first electrode 43. Subsequently, an isolating seal cap 49 (or an isolating protecting layer) capable of covering and protecting the organic layer 45 may be erected, by a seal pad 46, on the vertical-extending position of a part surface of the substrate 41. At the side of the isolating seal cap 49, corresponding to the position of a part of surface of the first electrode 43 or second electrode 47, such as the side ends of the first electrode 43 or second electrode 47, for example, there may be chiseled to form at least one first channel 495 or second channel 497.

The first channel 495 may be passed through by a first connecting line 44 having a conductive feature, two side ends of the first connecting line 44 being electrically contacting a part of surface of the first electrode 43 and a controller 60, such as a column driver, row driver, and central controller, respectively. Further, the controller 60 is provided to control the function of whether the power is supplied or not, such that the controller may control and determine which first electrode 43, formed at a specific position, may be supplied power. Likewise, The second channel 497 may be passed through by a second connecting line 48 having a conductive feature, two side ends of the second connecting line 48 being electrically contacting a part of surface of the second electrode 47 and a controller 63, such that the controller 63 may control and determine which second electrode 47 formed at a specific position, may be supplied power.

A sealing glue 445, 485, of course, may be formed both between the top surface of the first channel 495 and the first connecting line 44, as well as between the top surface of the second channel 497 and the second connecting line 48, whereby a clean condition inside the isolating seal cap 49 may be protected from ill effects caused by the exterior oxygen or wet.

In the structure of the OLED device according to the embodiment, only a small part of area of the substrate 41, the width thereof being much smaller than 1.0 mm, such as approximately 0.5 mm illustrated as a5, may be exposed outside the isolating seal cap 49, since the first electrode 43 or the second electrode 47 may be all covered inside the isolating seal cap 49. Therefore, at least an exposed width al of the first electrode of the conventional OLED structure could be eliminated in the present invention, such that the width a5 may be at most equivalent to an exposed width a2 of the conventional substrate.

Figure 6:
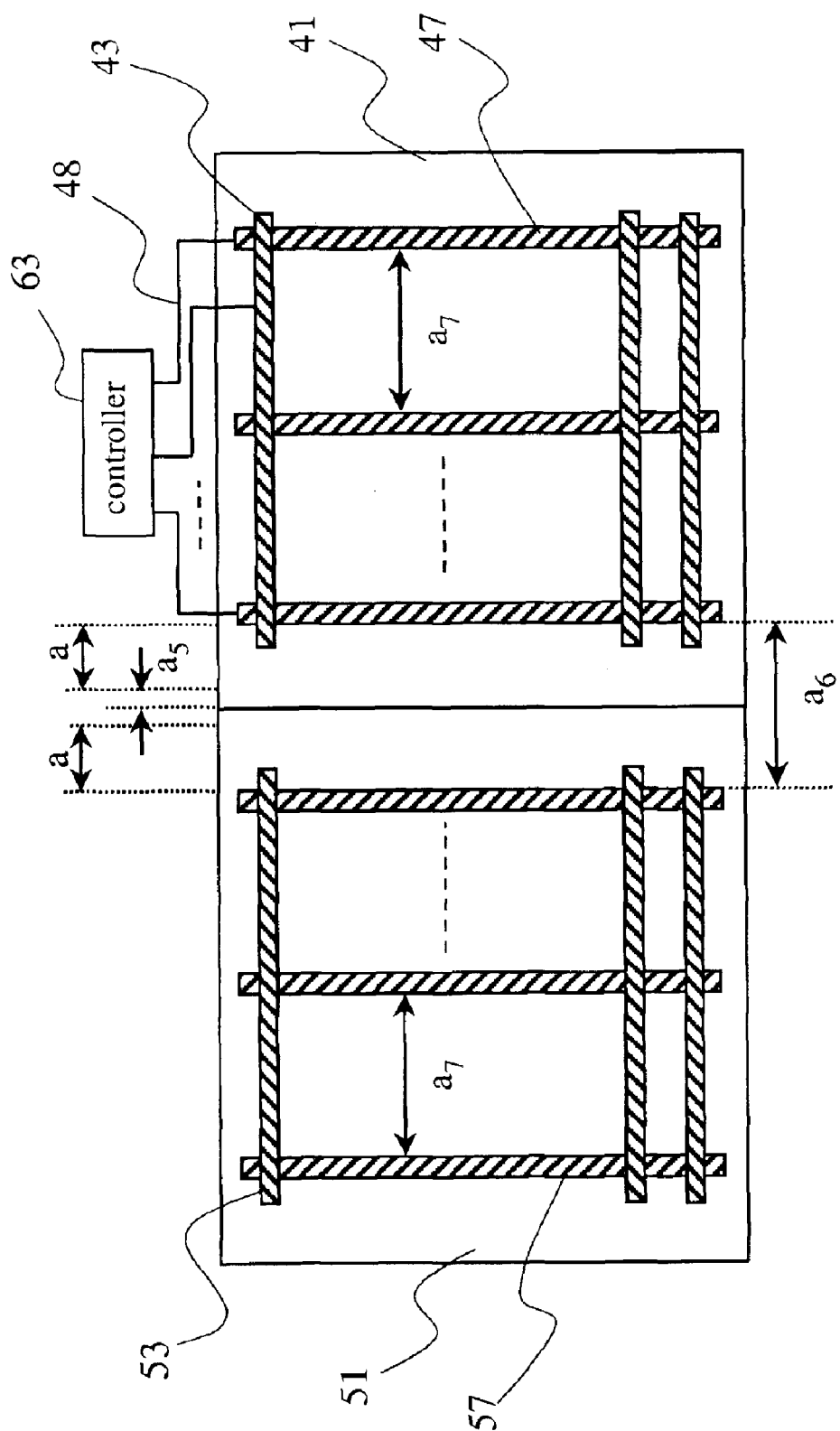
FIG. 6 is a diagrammatical top view of the organic electroluminescent device of the present invention when assembling.

Furthermore, referring to FIG. 6, there is shown a top view of the assembled larger-sized display with the OLED device of the present invention being contained therein; as shown in the figure, when two of the OLED devices 41, 51 assemble, a gap a6 presented between the adjacently-situated second electrodes 47, 57 of the two OLED devices 41, 51 is equivalent to the doubled (a5+a), much smaller than the gap a3 of the conventional structure, due to the fact that the width a5 of the portion of the substrate 41 exposed outside the isolating seal cap 49 is only approximately 0.5 mm in the structure of the present invention. As such, a pitch a7 between two adjacently-situated scanning lines or data lines is also just equivalent to the gap a6, approximately 1.0 mm, which is much smaller than 4.0 mm in the conventional OLED structure, such that a scanning line or data line with finer spacing may be obtained by the OLED device of the present invention, thereby the quality requirement for higher resolution and the more better adaptation for the assembly of the OLED device could be satisfied.

Figure 7:
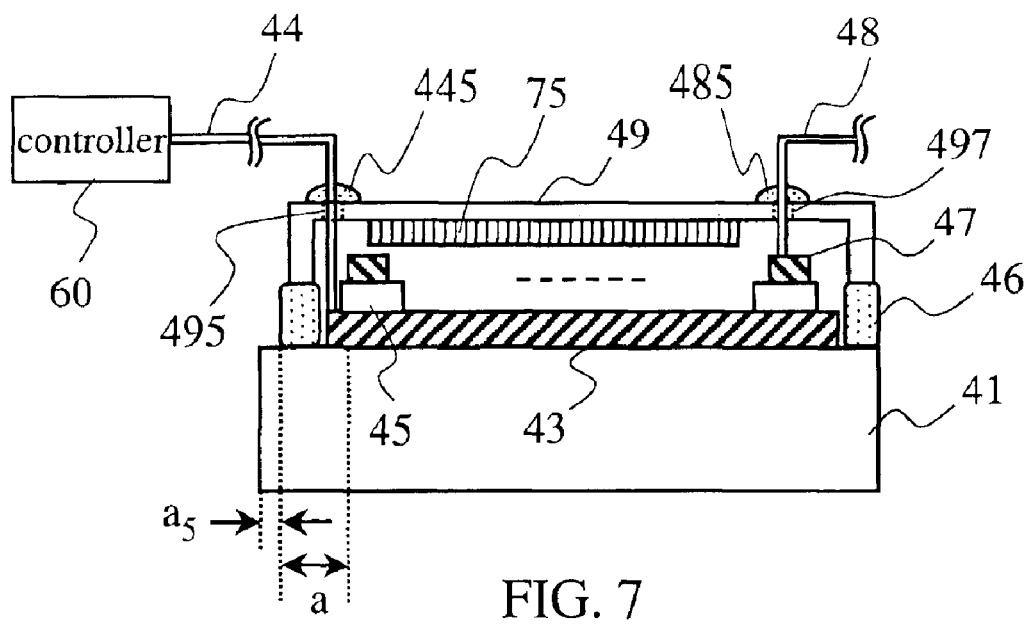
FIG. 7 is a structural cross-section view of an organic electroluminescent device of another embodiment of the present invention.

Further, referring to FIG. 7, there is shown a diagrammatical view for the structural cross-section of still another embodiment of the present invention; as shown in the figure, for the purpose of preventing the organic material of the light-emitting layer 45 from the effect of the outside environment, such as moisture, wet, or oxygen, for example, and hence the reduced quality of the illumination as well as the decreased service life, a moisture-absorbing layer 75 formed for absorbing moisture and wet will be fastened on an internal wall of the isolating seal cap 49.

Figure 8:
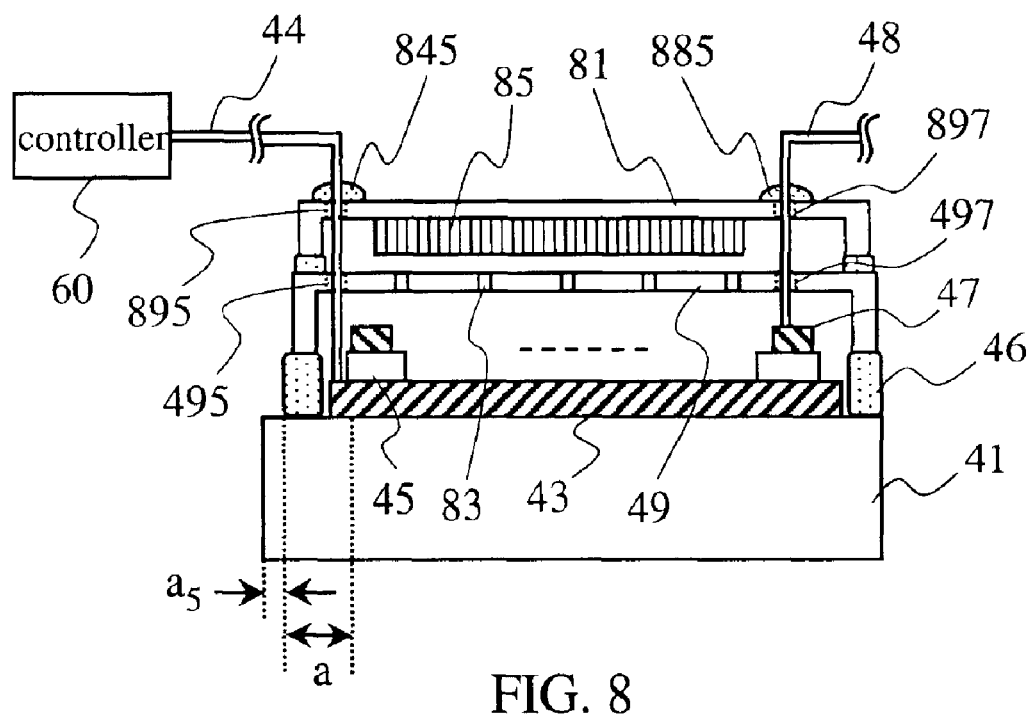
FIG. 8 is a structural cross-section view of an organic electroluminescent device of another embodiment of the present invention.

Further, referring to FIG. 8, there is shown a diagrammatical view for the structural cross-section of still another embodiment of the present invention; as shown in the figure, in this embodiment, it is characterized in that a second isolating seal cap 81 is further provided over the top surface of the isolating seal cap 49, that a moisture-absorbing layer 85 is fastened on an internal wall of the isolating seal cap 81, and that a plurality of vents 83, allowing moisture, wet, or oxygen passing through and then absorbed by the moisture-absorbing layer 85, is formed on the isolating seal cap 49 by chiseling. As such, a pity of harming the light-emitting layer 45 due to the drop of the moisture-absorbing layer 85 will be avoided. At least one third channel 895, of course, may be further formed, by chiseling, on the second isolating seal cap 81, such that the first connecting line 44 may be contacted with a part of surface of the first electrode 44 through the third channel 895 and first channel 495, and a third sealing glue 845 may be presented between the top surface of the first connecting line 44 and that of the third channel 895. In addition, at least one fourth channel 897 is also formed, by chiseling, on the second isolating seal cap 81, such that the second connecting line 48 may be contacted with a part of surface of the second electrode 47 through the fourth channel 897 and second channel 497, and a fourth sealing glue 885 may be presented between the top surface of the second connecting line 48 and that of the fourth channel 897.

Figure 9:
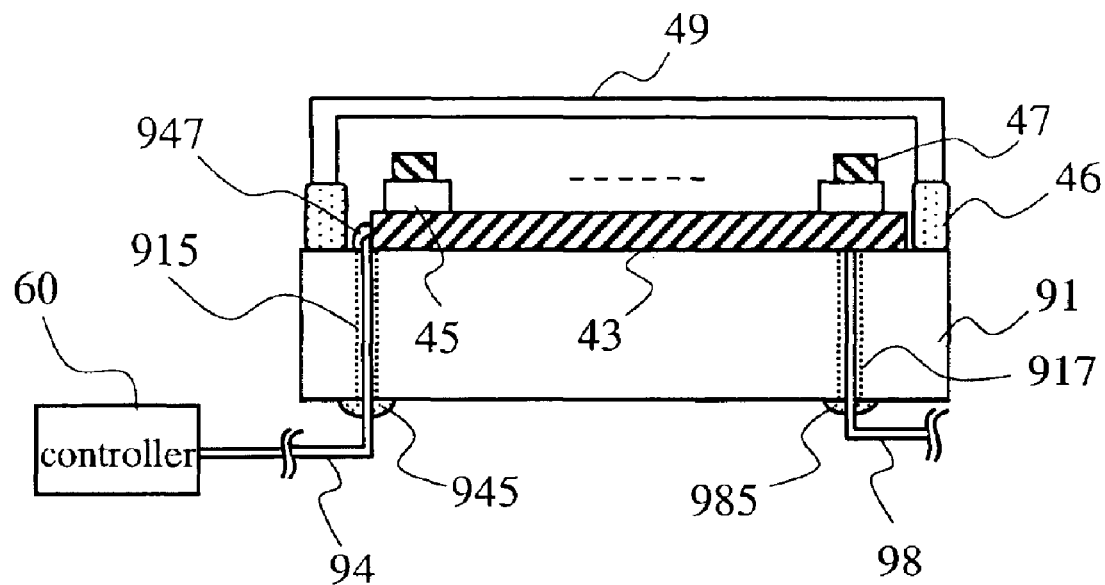
FIG. 9 is a structural cross-section view of an organic electroluminescent device of another embodiment of the present invention.

Moreover, referring to FIG. 9, there is shown a diagrammatical view for the structural cross-section of still another embodiment of the present invention; as shown in the figure, in this embodiment, it is characterized in that at least one first substrate channel 915 is formed, by chiseling, on the substrate 91, provided for the first connecting line 94 to contact with a part of surface of the first electrode 43 therethrough, and that a first substrate sealing glue 945 may be presented between the first connecting line 94 and the bottom surface of the first substrate channel 915. On the other side of the substrate 91, of course, at least one second substrate channel 917 is formed by chiseling, provided for the second connecting line 98 to contact with a part of surface of the second electrode 47 therethrough, and that a second substrate sealing glue 985 may be presented between the second connecting line 98 and the bottom surface of the second substrate channel 917. As such, the light-emitting layer 45 may emit light toward the isolating seal cap 49, without the light-obstructing effect resulted from the connecting line or sealing glue.

Figure 10:
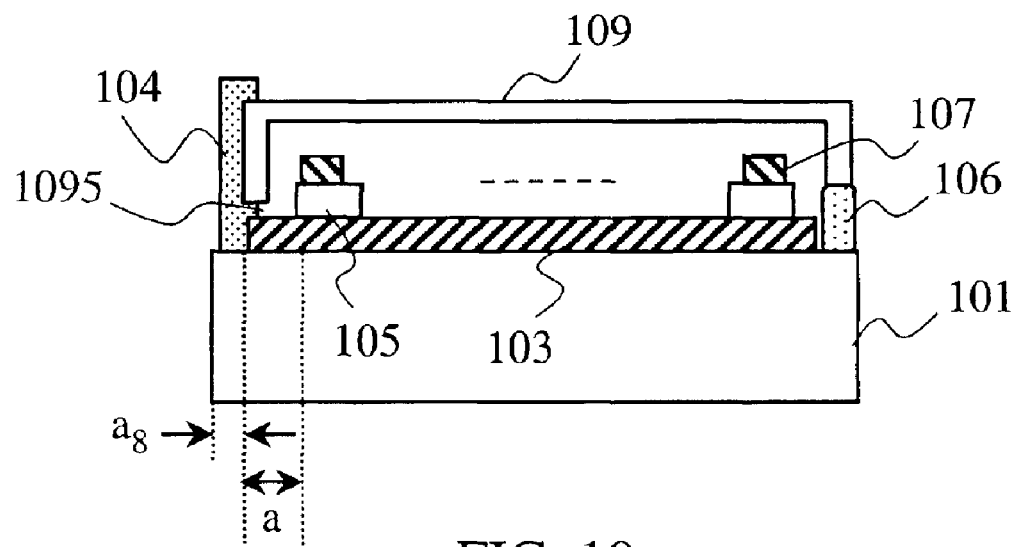
FIG. 10 is a structural cross-section view of an organic electroluminescent device of another embodiment of the present invention.

Finally, referring to FIG. 10, there is shown a structural cross-section view of another embodiment of the present invention; as shown in the figure, the essential construction comprises forming a first electrode 103 on a part of surface of a substrate 101, and forming at least one light-emitting layer 105 including an organic emitting layer, and a second electrode 107 in turn onto the appropriate position of the first electrode 103. Subsequently, an isolating seal cap 109 (or an isolating protecting layer) capable of covering and protecting the organic layer 105 may be erected on the vertical-extending position of a part surface of the substrate 101. In this embodiment, one bottom end of the isolating seal cap 109 may be adhered to the surface of the substrate 101 directly via a seal pad 106, and the other end thereof may be situated at a vertical-extending position from the side end of the first electrode 103, leaving a conductive channel 1095 between said other end and the surface of the first electrode 103. A surface-mounted line 104 is formed by oblique deposition or flat deposition at the corresponding side of the conductive channel 1095 or isolating seal cap 109, served as a conductive way for connecting the first electrode 103 and the controller (60). Likewise, there is also a conductive channel and a surface-mounted line formed at the other side end of the second electrode 107 and the corresponding bottom end of the isolating seal cap 109, served as a conductive way for connecting the second electrode 107 and the controller (63).

In this embodiment, only a part of area of the substrate 101 is the member being exposed outside the isolating seal cap 109, in which a width a8 is approximately equivalent to a5 in the above embodiment, which will be not more than 1.0 mm. Therefore, likewise, an effectively raised quality requirement for high resolution and better adaptation for the assembly function may be readily achieved.

To sum up, it should be understood that the present invention is related to an organic electroluminescent device, particularly to an organic electroluminescent device adapted for assembly function. Not only adapting for the assembly for a larger-sized display device, but also effectively raising the quality requirement for high resolution of the light-emitting device may be provided. Therefore, this application is filed in accordance with the patent law duly, since the present invention is truly an invention with novelty, advancement or non-obviousness, and availability by the industry, thus naturally satisfying the requirements of patentability. Your favorable consideration will be appreciated.

The foregoing description is merely one embodiment of present invention and not considered as restrictive. All equivalent variations and modifications in process, method, feature, and spirit in accordance with the appended claims may be made without in any way from the scope of the invention.

LIST OF REFERENCE SYMBOLS

11 substrate
13 first electrode
14 first connecting line
15 light-emitting layer
16 seal pad
17 second electrode
18 second connecting line
19 isolating seal cap
21 substrate
23 first electrode
27 second electrode
30 controller
33 controller
41 substrate
43 first electrode
44 first connecting line
445 first sealing glue
45 light-emitting layer
46 seal pad
47 second electrode
48 second connecting line
485 second sealing glue
49 isolating seal cap
495 first channel
497 second channel
51 substrate
53 first electrode
57 second electrode
60 controller
63 controller
65 moisture-absorbing layer
75 moisture-absorbing layer
81 second isolating seal cap
83 vent
845 third sealing glue
85 moisture-absorbing layer
885 fourth sealing glue
895 third channel
897 fourth channel
91 substrate
915 first substrate channel
917 second substrate channel
94 first connecting line
945 first substrate sealing glue
947 fixing point
98 second connecting line
985 second substrate sealing glue
101 substrate
103 first electrode
104 surface-mounted line
105 moisture-absorbing layer
106 side seal pad
107 second electrode
108 isolating seal cap
1095 conductive channel

What is claimed is:

1. An organic electroluminescent device adapted for assembly function, comprising:

a substrate;

at least one first electrode formed on a portion of a surface of said substrate, wherein a part of a surface of a first layer overlaying said first electrode comprises at least one light-emitting layer and a second electrode in turn;

at least one isolating seal cap formed at the surface of said substrate for covering and protecting said light-emitting layer, wherein one side of said isolating seal cap comprises at least one first channel;

at least one first connecting line passing through said first channel and contacting a part of a surface of said first electrode; and, a second isolation seal cap formed and fastened at a top surface of said isolation seal cap and having a channel at one side thereof, such that said first connecting line passes through said channel of said second isolation seal cap and said first channel of said isolation seal cap to contact said part of said surface of said first electrode, wherein an internal wall of said second isolating seal cap comprises at least one moisture-absorbing layer.

2. The organic electroluminescent device according to claim 1, wherein a sealing glue with an isolation function is formed between the top surface of said first channel and said first connecting line.

3. The organic electroluminescent device according to claim 1, wherein said first electrode is covered inside said isolation seal cap completely.

4. The organic electroluminescent device according to claim 1, wherein at least one seal pad is formed at a bottom side of said isolation seal cap, such that said isolation seal cap may be erected on a part of a surface of said substrate, for covering as well as protecting said light-emitting layer.

5. The organic electroluminescent device according to claim 1, further comprising:
 at least one second channel formed on another side of said isolating seal cap; and
 at least one second connecting line passing through said second channel and contacting a part of a surface of said second electrode, wherein a sealing glue with an isolation function is formed between the top surface of said second channel and said second connecting line.

6. The organic electroluminescent device according to claim 5, wherein said first connecting line and said second connecting line are connected to corresponding controllers, respectively.

7. The organic electroluminescent device according to claim 1, wherein a width of a part of surface of said substrate not covered by a vertical-extending position of said isolation seal cap is not greater than 1.0 mm.

8. The organic electroluminescent device according to claim 1, wherein at least one through-vent is formed through said isolation seal for substances to pass therethrough.

9. The organic electroluminescent device according to claim 1, wherein a sealing glue with an isolation function is formed between a top surface of said channel of said second isolation seal cap and said first connecting line.

10. The organic electroluminescent device according to claim 5, wherein said second isolation seal cap has at least one additional channel formed on another side thereof, such that said second connecting line passes through said additional channel of said second isolation seal cap and said second channel of said isolation seal cap to contact said part of said surface of said second electrode, wherein a sealing glue with an isolation function is formed between the top surface of said additional channel of said second isolation seal cap and said second connecting line.

* * * * *